US012743279B2

(12) United States Patent
Wu

(10) Patent No.: US 12,743,279 B2
(45) Date of Patent: Sep. 22, 2026

(54) APPARATUS AND METHOD OF GENERATING CHIP SELECT SIGNALS

(71) Applicant: ChangXin Memory Technologies, Inc., Hefei CIty (CN)

(72) Inventor: Zengquan Wu, Hefei City (CN)

(73) Assignee: ChangXin Memory Technologies, Inc., Hefei (CN)

( * ) Notice: Subject to any disclaimer, the term of this patent is extended or adjusted under 35 U.S.C. 154(b) by 1088 days.

(21) Appl. No.: 17/796,724

(22) PCT Filed: Jun. 1, 2022

(86) PCT No.: PCT/CN2022/096693
§ 371 (c)(1),
(2) Date: Aug. 1, 2022

(87) PCT Pub. No.: WO2023/216344
PCT Pub. Date: Nov. 16, 2023

(65) Prior Publication Data

US 2024/0264835 A1 Aug. 8, 2024

(30) Foreign Application Priority Data

May 13, 2022 (CN) ......................... 202210521970.0

(51) Int. Cl.
*G11C 7/00* (2006.01)
*G06F 1/3203* (2019.01)
(Continued)

(52) U.S. Cl.
CPC ........ *G06F 9/30083* (2013.01); *G06F 1/3203* (2013.01); *G06F 9/3004* (2013.01); *G06F 30/3308* (2020.01)

(58) Field of Classification Search
CPC ............. G06F 9/30083; G06F 30/3308; G06F 1/3203; G06F 9/3004
(Continued)

(56) References Cited

U.S. PATENT DOCUMENTS 5,369,309 A * 11/1994 Bacrania ................. G05F 3/262 327/100
6,791,907 B2 * 9/2004 Berhan ................ G11B 27/002
(Continued)

FOREIGN PATENT DOCUMENTS

CN 110470987 A * 11/2019 ............. G01R 31/34
CN 117093264 A * 11/2023 ........... G06F 9/3004
WO WO-9309599 A2 * 5/1993 ........... H10D 84/401

OTHER PUBLICATIONS

First Office Action in the Chinese Patent Application No. 202210521970.0, dated Apr. 30, 2026; English translation attached.

*Primary Examiner* — Viet Q Nguyen
(74) *Attorney, Agent, or Firm* — Intellectual Valley Law, P.C.

(57) ABSTRACT

A method and apparatus for generating a chip select signal include: sampling an external control signal to obtain a first and a second sampling signals; inputting the first sampling signal into a first vector file to generate a power supply control signal; inputting the second sampling signal into a second vector file to generate a chip select control signal; generating a chip select signal based on the power supply control signal and the chip select control signal, which include a high potential, a low potential and a high resistance state, the high potential voltages of the power supply control signal and the chip select control signal are different, and the low potential voltages of the power supply control signal and the chip select control signal are different. The disclo-
(Continued)

sure realizes four different potentials for the chip select signals by applying two vector files.

16 Claims, 6 Drawing Sheets

(51) Int. Cl.
*G06F 9/30* (2018.01)
*G06F 30/3308* (2020.01)

(58) Field of Classification Search
USPC .......................................................... 365/191
See application file for complete search history.

(56) References Cited

U.S. PATENT DOCUMENTS

| | | | | |
|---|---|---|---|---|
| 8,600,739 | B2 * | 12/2013 | Zhang | G10L 19/24<br>704/223 |
| 10,320,323 | B1 * | 6/2019 | Wu | H02M 7/5395 |
| 11,874,694 | B2 * | 1/2024 | Nagao | H05B 45/325 |
| 11,978,502 | B2 * | 5/2024 | Huang | G11C 7/1093 |
| 12,046,271 | B2 * | 7/2024 | Cheng | G11C 7/222 |
| 12,047,080 | B2 * | 7/2024 | Huang | H03K 19/20 |
| 2007/0101177 | A1 * | 5/2007 | Kuroki | G06F 1/06<br>713/500 |
| 2012/0326775 | A1 | 12/2012 | Heo | |

* cited by examiner

Apparatus for generating chip select signals
501
first sampling module
502
first vector file
503
second vector file
504
processing module

APPARATUS AND METHOD OF GENERATING CHIP SELECT SIGNALS

CROSS REFERENCES TO RELATED APPLICATIONS

This application claims the priority of the Chinese patent application with the application number 202210521970.0 and the application title, "An Apparatus and Method For Generating Chip Select Signals", filed with the National Intellectual Property Administration on May 13, 2022, the contents of which are incorporated herein by reference in its entirety.

TECHNICAL FIELD

Embodiments of the present disclosure relate to the technical field of semiconductors, and in particular, to an apparatus and method for generating a chip select (CS for short) signal.

BACKGROUND

With the development of semiconductor technology, the fifth-generation Low Power Double Data Rate SDRAM 5 (LPDDR5) has been widely used in various electronic products.

Since the clock enable signal (CKE) pin is removed in LPDDR5, the function of the clock enable signal is not substantially removed. Therefore, the clock enable function needs to be implemented based on other signals or signal ports.

SUMMARY

The embodiments of the present disclosure provide a method and apparatus for generating a chip select signal, which can realize CS signals with four different potentials, thereby simultaneously realizing a chip select function and a clock enable function.

In a first aspect, an embodiment of the present disclosure provides a method for generating a chip select signal, the method comprising:

receiving an external control signal input from the chip select port, and sampling the external control signal to obtain a first sampling signal and a second sampling signal;

inputting the first sampled signal into a first vector file to generate a power supply control signal; and inputting the second sampling signal into a second vector file to generate a chip select control signal; wherein the power supply control signal and the chip select control signal include high potential, low potential and high impedance state, and the voltage values of the power supply potential of the control signal of the and the chip select control signal are different, and the voltage values of the power supply control signal and the low potential of the chip select control signal are different;

wherein the chip selection signal is generated based on the power supply control signal and the chip select control signal, and the chip selection signal is used to perform a power supply control operation and a chip selection operation.

In a feasible implementation manner, the first vector file is used to simulate a first MOS transistor and a second MOS transistor, the first MOS transistor and the second MOS transistor are of different types, and the first MOS transistor is of different type. The drain of the transistor is connected to the first high level, the source of the first MOS transistor is connected to the drain of the second MOS transistor as an output terminal, and the source of the second MOS transistor is connected to the first high level. low-level connection; inputting the first sampling signal into the first vector file to generate a power supply control signal, including:

inputting the first sampling signal into the gate of the first MOS transistor and the gate of the second MOS transistor to turn on the first MOS transistor or the second MOS transistor and output the power supply control signal.

In a feasible implementation manner, the first MOS transistor is a PMOS transistor, and the second MOS transistor is an NMOS transistor.

In a feasible implementation manner, the second vector file is used to simulate a third MOS transistor and a fourth MOS transistor, the third MOS transistor and the fourth MOS transistor are of different types, and the third MOS transistor is of different type. The drain of the transistor is connected to the second high level, the source of the third MOS transistor is connected to the drain of the fourth MOS transistor as an output terminal, and the source of the fourth MOS transistor is connected to the second high level. low-level connection; inputting the second sampling signal into the second vector file to generate a chip select control signal, including:

inputting the second sampling signal into the gate of the third MOS transistor and the gate of the fourth MOS transistor to turn on the third MOS transistor or the fourth MOS transistor and output the chip select control signal.

In a feasible implementation manner, the third MOS transistor is a PMOS transistor, and the fourth MOS transistor is an NMOS transistor.

In a feasible implementation manner, the voltage value of the first high level is greater than the voltage value of the second high level, and the voltage value of the first low level is smaller than the voltage value of the second low level.

In a feasible implementation manner, the first vector file is used to simulate a first MOS transistor and a second MOS transistor, the first MOS transistor and the second MOS transistor are of the same type, and the first MOS transistor is of the same type. The drain of the transistor is connected to the first high level, the source of the first MOS transistor is connected to the drain of the second MOS transistor as an output terminal, and the source of the second MOS transistor is connected to the first high level. low-level connection; inputting the first sampling signal into the first vector file to generate power supply control signal, including:

Inputting the first sampling signal to the gate of the first MOS transistor, and inputting the inverted signal of the first sampling signal to the gate of the second MOS transistor to turn on the first MOS transistor or the second MOS transistor and output the power supply control signal.

In a feasible implementation manner, after generating the chip select signal based on the power supply control signal and the chip select control signal, the method further includes:

sampling the chip selection signal to obtain the power supply control signal and the chip select control signal.

In a feasible implementation manner, after the sampling of the chip selection signal to obtain the power supply control signal and the chip select control signal, the method further includes:

inputting the power supply control signal to a preset power supply circuit, so that the power supply circuit outputs an excitation signal or a shutdown signal based on the power supply control signal, and the excitation signal is used to enable a preset storage circuit, and the shutdown an off signal is used to turn off the storage circuit;

and inputting the chip select control signal to the storage circuit, so that the enabled storage circuit performs a chip selection operation based on the chip select control signal.

In a second aspect, an embodiment of the present disclosure provides an apparatus for generating a chip select signal, the apparatus comprising:

a first sampling module, configured to receive an external control signal input from a chip select port, and sample the external control signal to obtain a first sampling signal and a second sampling signal;

a first vector file for receiving the first sampling signal and outputting a corresponding power supply control signal based on the first sampling signal;

a second vector file, used for receiving the second sampling signal, and outputting a corresponding chip select control signal based on the second sampling signal;

wherein the forms of the power supply control signal and the chip select control signal include high potential, low potential and high resistance state, and the voltage values of the power supply control signal and the high potential of the chip select control signal are different. The voltage values of the low potential of the control signal and the chip select control signal are different.

The processing module is configured to generate the chip selection signal based on the power supply control signal and the chip select control signal, where the chip selection signal is used to perform a power supply control operation and a chip selection operation.

In a feasible implementation manner, the first vector file is used to simulate a first MOS transistor and a second MOS transistor, the first MOS transistor and the second MOS transistor are of different types, and the first MOS transistor is of different type. The drain of the transistor is connected to the first high level, the source of the first MOS transistor is connected to the drain of the second MOS transistor as an output terminal, and the source of the second MOS transistor is connected to the first high level. low level connection.

The gate of the first MOS transistor and the gate of the second MOS transistor are used for receiving the first sampling signal.

In a feasible implementation manner, the second vector file is used to simulate a third MOS transistor and a fourth MOS transistor, the third MOS transistor and the fourth MOS transistor are of different types, and the third MOS transistor is of different type. The drain of the transistor is connected to the second high level, the source of the third MOS transistor is connected to the drain of the fourth MOS transistor as an output terminal, and the source of the fourth MOS transistor is connected to the second high level. low level connection;

The gate of the third MOS transistor and the gate of the fourth MOS transistor are used for receiving the second sampling signal.

In a feasible implementation manner, the voltage value of the first high level is greater than the voltage value of the second high level, and the voltage value of the first low level is smaller than the voltage value of the second low level.

In a feasible implementation manner, it also includes a second sampling module wherein:

The chip selection signal is sampled to obtain the power supply control signal and the chip select control signal.

In a third aspect, embodiments of the present disclosure provide an electronic device, including: at least one processor and a memory, wherein the memory stores computer-executable instructions;

The at least one processor executes the computer-executable instructions stored in the memory, so that the at least one processor executes the method for generating a chip select signal provided by the first aspect.

In a fourth aspect, an embodiment of the present disclosure provides a computer-readable storage medium, where computer-executable instructions are stored in the computer-readable storage medium, and when a processor executes the computer-executable instructions, the chip as provided in the first aspect is implemented.

The method and apparatus for generating a chip select signal provided by the embodiments of the present disclosure include: obtaining a first sampling signal and a second sampling signal by sampling an external control signal; inputting the first sampling signal into a first vector file to generate a power supply control signal input the second sampling signal into the second vector file to generate the chip select control signal; generate the chip selection signal based on the power supply control signal and the chip select control signal; wherein, the voltage value of the high potential of the power supply control signal and the chip select control signal is different, the voltage value of the low potential of the power supply control signal and the chip select control signal is different, so that the above two vector files can be used to realize the chip selection signal with 4 different potentials, two of which are used to realize the chip selection function, and the other two of the potentials are used to implement the clock enable function.

DETAILED DESCRIPTION OF THE PREFERRED EMBODIMENTS

Figure 1:
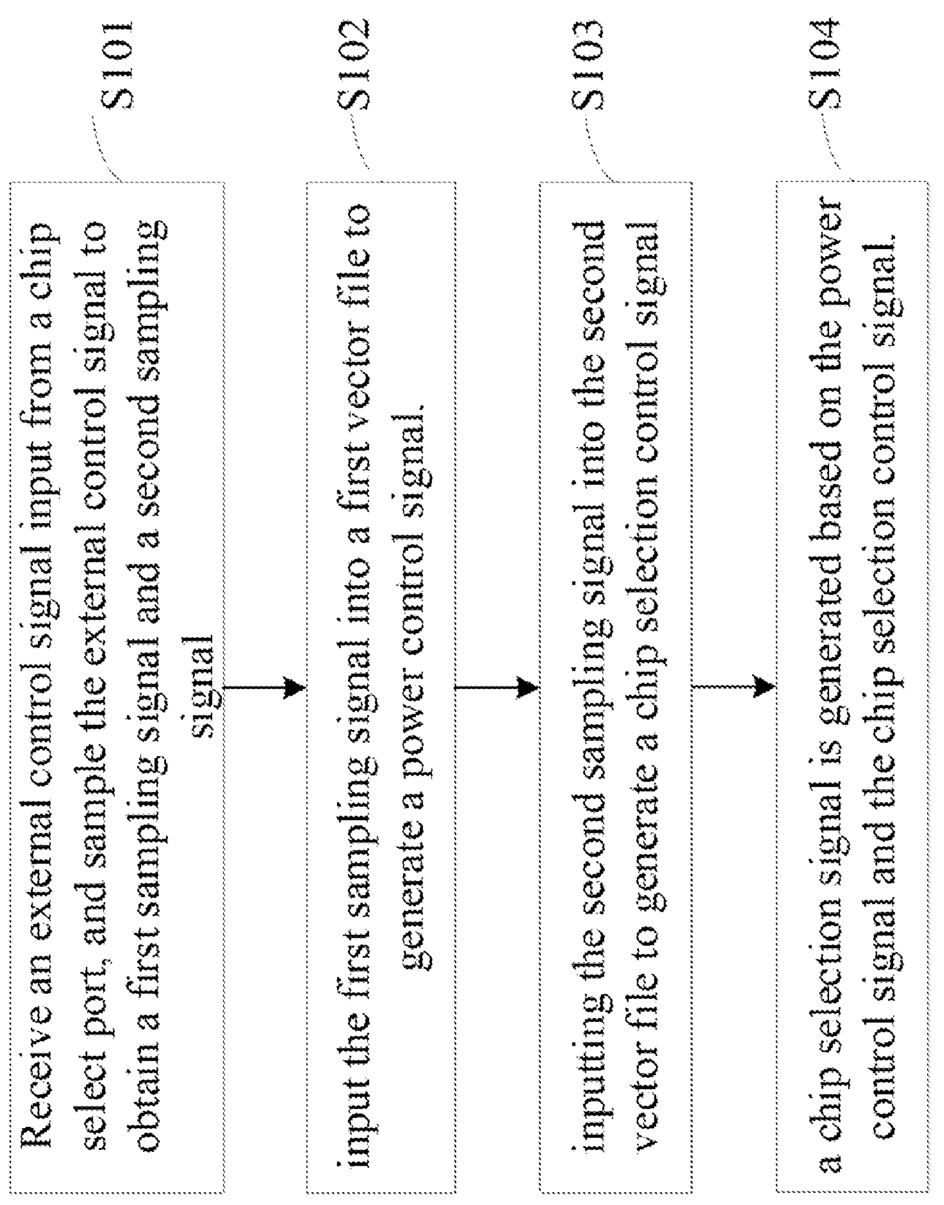
FIG. 1 is a schematic flowchart of steps of a method for generating a chip select signal provided in an embodiment of the present disclosure.

The purposes, technical solutions and advantages of the embodiments of the present disclosure will be described clearly and completely below with reference to the accompanying drawings. Obviously, the described embodiments are only some, but not all, of the present disclosure. Based on the embodiments in the present disclosure, all other embodiments obtained by those of ordinary skill in the art without creative efforts shall fall within the protection scope of the present disclosure. Furthermore, although the disclosures have been presented in terms of illustrative examples, it should be understood that various aspects of this disclosure may also constitute a complete embodiment independently.

It should be noted that the brief description of terms in the present disclosure is only for the convenience of understanding the embodiments described below, rather than intended to limit the embodiments of the present disclosure. Unless otherwise specified, these terms are to be understood according to their ordinary and ordinary meanings.

The terms “first”, “second” and the like in the description and claims of the present disclosure and the above drawings are used to distinguish similar or similar objects or entities, and are not necessarily meant to limit a specific order or sequence. unless otherwise noted. It is to be understood that the terms so used are interchangeable under appropriate circumstances, e.g., can be implemented in an order other than those presented in the illustrations or descriptions of embodiments in accordance with the present disclosure.

Furthermore, the terms “comprising” and “having” and any variations thereof, are intended to cover but not exclusively include, for example, a product or device incorporating a series of components is not necessarily limited to those explicitly listed, but may include No other components are expressly listed or inherent to these products or devices.

The term “module” used in the embodiments of the present disclosure refers to any known or later developed hardware, software, firmware, artificial intelligence, fuzzy logic, or combination of hardware or/and software codes capable of performing the functions associated with the element.

The embodiments of the present disclosure can be applied in the field of semiconductor technology, for example, can be used to generate a CS signal in a memory.

In the field of semiconductor technology, the CS signal generally refers to a signal used when selecting one or a certain integrated circuit chip. The reason for this choice is that, sometimes it is necessary to independently transmit data, addresses or commands to a specific chip but there are many chips hanging on the same bus. So at this time, the CS signal is needed to tell the hanging chips on the bus that which chips are these data and addresses should be transmitted to. In this way, other chips will not respond to these CS signals, and the target chip will know that the data is sent to itself and it should respond accordingly.

Not only does the chip select function need to be used when there are multiple chips in the circuit, but also when only one chip is used, the chip select function is often used to save power and prolong the chip life. For example, one can use the CS signal to make it work only when the chip needs to be used, and automatically cancel the chip select signal when there is no action within a specified time, so that it is in a non-working low-power (power down) mode.

LPDDR5 typically includes the following pins:

CK_t/CK_c: address/command clock, use simultaneous sampling on rising edge/falling edge, and differential clock input;

CS: chip select signal, the rising edge (falling edge) of the clock is sampled to select the target chip;

CA[6:0]: command/address input;

DQ[15:0]: data input/output bus;

WCK[1:0]_t/WCK[1:0]_c: write clock, which is differential input;

RDQS[1:0]_t/RDQS[1:0]_c: read strobe signal (read clock), which is differential output;

DMI[1:0] the data bus is flipped, and each byte of data is followed by a DMI.

Compared with LPDDR4, the clock enable signal (CKE) pin is removed in LPDDR5, so that the CS pin needs to have 4 different potentials to achieve the function of exiting the power down mode and its own chip select function. to realize the CS signal. However, how to realize the CS signal with 4 different potentials needs to be solved urgently.

Faced with the above technical problems, an embodiment of the present disclosure provides a method for generating chip select signals, which can utilize two vector files to realize chip select signals with four different potentials. For specific implementation manners, please refer to the contents in the following examples.

Referring to FIG. 1, FIG. 1 is a schematic flowchart of steps of a method for generating a chip select signal according to an embodiment of the present disclosure. In some embodiments of the present disclosure, the above-mentioned method for generating a chip select signal includes:

S101: Receive an external control signal input from a chip select port, and sample the external control signal to obtain a first sampling signal and a second sampling signal.

Herein, the above-mentioned chip select port may be a CS pin.

In some embodiments, when an external control signal input from a chip select port is received, the external control signal is sampled according to a preset sampling frequency to obtain a first sampling signal and a second sampling signal.

S102: input the first sampling signal into a first vector file to generate a power supply control signal.

Herein, after the first sampling signal is input into the first vector file, the first vector file can generate a power supply control signal according to the first sampling signal, and the power supply control signal can include a high potential, a low potential, a high impedance state, an indeterminate state, etc.

Among them, the high-impedance state is neither high-level nor low-level. Its limit state can be considered to be floating (open circuit). After the high-impedance state is input to the next-level circuit, it has no effect on the lower-level circuit, and it is the same as not connected.

Indeterminate state means that the voltage output on the pin is between the high potential and the first potential, and the level state is in an uncertain state.

Exemplarily, the first sampling signal may be composed of two level signals. When the two level signals are 0 and 0, respectively, the output of the first vector file is a high level; when the two level signals are 1 and 1, respectively, the output of the first vector file is a low potential; when the two level signals are 1, 0, the first vector file output is a high-impedance state; when the two level signals are 0, 1, respectively, the output of the first vector file is indefinite. Among them, 0 means low level, 1 means high level.

In some embodiments, the above-mentioned power supply control signal is used to perform power control operations, such as controlling the chip to exit the power down mode or enter the working state, that is, to implement the function of the clock enable signal.

S103: inputting the second sampling signal into the second vector file to generate a chip select control signal.

Wherein, after the second sampling signal is input into the second vector file, the second vector file can generate a chip select control signal according to the second sampling signal, and the chip select control signal can include a high potential, a low potential, a high impedance state and an indeterminate state equal form.

Exemplarily, the second sampling signal can also be composed of two level signals. When the two level signals are 0 and 0 respectively, the output of the second vector file is a high level; when the two level signals are respectively 1, 1, the output of the second vector file is low potential; when the two level signals are 1, 0, the second vector file output is high impedance; when the two level signals are 0, 1 respectively, the output of the second vector file is indeterminate. Among them, 0 means low level, 1 means high level.

In some embodiments, the above-mentioned chip select control signal is used to perform a chip select operation.

In some embodiments, the voltage values of the high potential of the power supply control signal and the chip select control signal are different, and the voltage values of the low potential of the power supply control signal and the chip select control signal are also different.

In some embodiments, when the power supply control signal is at a high potential or a low potential, the chip select control signal is at a high impedance state, and when the chip select control signal is at a high potential or a low potential, the power supply control signal is at a high impedance state.

In some embodiments, both the above-mentioned first vector file and the second vector file may use Vector files.

S104, a chip selection signal is generated based on the power supply control signal and the chip select control signal.

In some embodiments, after the power supply control signal and the chip select control signal are generated, the power supply control signal and the chip select control signal may be synthesized into a chip selection signal.

For example, suppose that the voltage value of the high potential of the power supply control signal is H1 and the voltage value of the low potential is L1; the voltage value of the high potential of the chip select control signal is H2 (H1≠H2), and the voltage value of the low potential is L2 (L1≠L2). Since when the power supply control signal is at a high potential or a low potential, the chip select control signal is in a high-impedance state, when the chip select control signal is at a high potential or a low potential, the power supply control signal is in a high-impedance state. Therefore, the chip select signal generated based on the power supply control signal and the chip select control signal may have four different potentials of H1, H2, L1, and L2.

Figure 2:
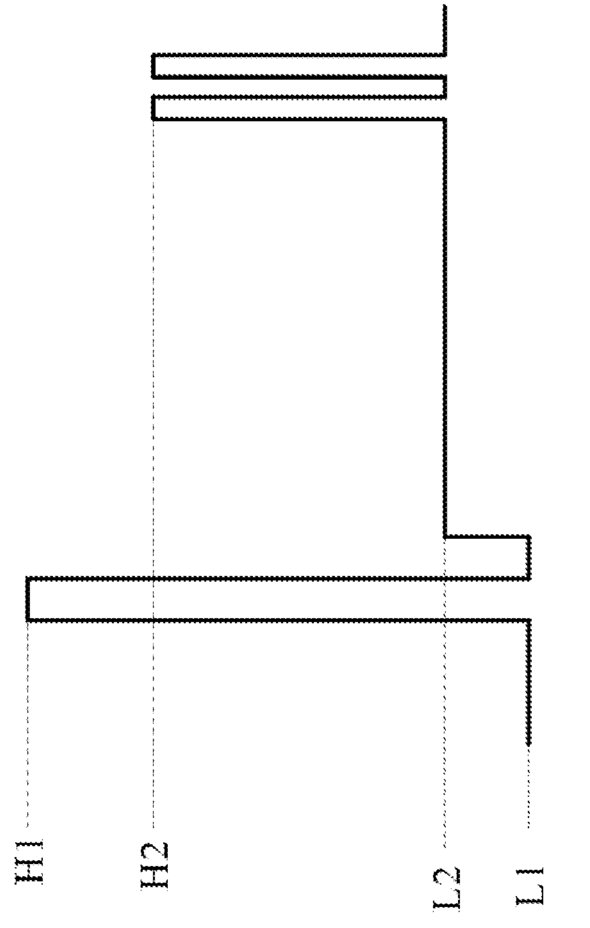
FIG. 2 is a chip select signal chart generated in an embodiment of the present disclosure.

For a better understanding of the embodiment of the present disclosure, refer to FIG. 2, which is a chip select signal chart generated in the embodiment of the present disclosure.

In some embodiments, since the chip select signal has four different potentials, the chip select signal can be used to perform power control operation and chip select operation. Specifically, the chip select operation is performed first, and then the power control operation is performed.

In the method for generating a chip select signal provided by the embodiment of the present disclosure, a first sampling signal and a second sampling signal are obtained by sampling an external control signal; the first sampling signal is input into a first vector file to generate a power supply control signal; the sampling signal is input into the second vector file to generate the chip select control signal; the chip selection signal is generated based on the power supply control signal and the chip select control signal; wherein, the voltage value of the high potential of the power supply control signal and the chip select control signal is different, and the power supply control signal. It is different from the voltage value of the low potential of the chip select control signal, so that the above two vector files can be used to realize the chip selection signal with 4 different potentials.

Based on the content described in the above embodiments, in some embodiments, the above-mentioned first vector file and the second vector file can be used to simulate a signal processing circuit composed of some specific semiconductor devices, and the signal processing circuit can be based on the above-mentioned first vector file. A first sampled signal and a second sampled signal to generate the chip select signal.

Figure 3:
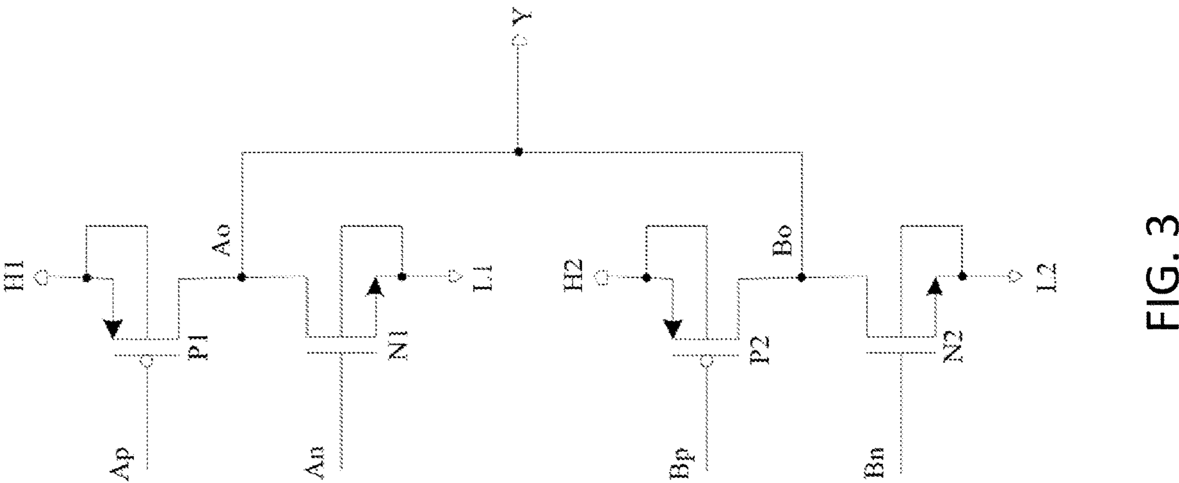
FIG. 3 is a schematic block diagram of a signal processing circuit simulated by a first vector file and a second vector file provided in an embodiment of the present disclosure.

For a better understanding of the embodiment of the present disclosure, refer to FIG. 3, which is a schematic diagram of a signal processing circuit simulated by a first vector file and a second vector file provided in an embodiment of the present disclosure.

In some embodiments of the present disclosure, the above-mentioned first vector file is used to simulate the first MOS transistor P1 and the second MOS transistor N1. The types of the first MOS transistor P1 and the second MOS transistor N1 are different.

Optionally, the first MOS transistor P1 may be a PMOS transistor, and the second MOS transistor N1 may be an NMOS transistor.

In some embodiments, the source of the first MOS transistor P1 is connected to the first high level H1, the drain is connected to the drain of the second MOS transistor N1 to serve as the output terminal Ao, and the source of the second MOS transistor N1 Connected to the first low level L1.

In some embodiments, after the first sampling signal is obtained, the first sampling signal is input to the gate Ap of the first MOS transistor P1 and the gate An of the second MOS transistor N1 to turn on the first MOS transistor or the second MOS transistor, and the signal output by the output terminal Ao is used as the above-mentioned power supply control signal. It can be understood that inputting the first sampling signal into the gate Ap of the first MOS transistor P1 and the gate An of the second MOS transistor N1 means: sampling the first sampling signal after obtaining the first sampling signal, to obtain the first signal and the second signal, the first signal is input to the gate Ap of the first MOS transistor P1, and the second signal is input to the gate An of the second MOS transistor N1 to generate a power supply control signal.

As an example, in the case where the first MOS transistor P1 is a PMOS transistor and the second MOS transistor N1 is an NMOS transistor, based on the working principles of the PMOS transistor and the NMOS transistor, it is known the following.

When both the gate Ap of the first MOS transistor P1 and the gate An of the second MOS transistor N1 input a low level, the first MOS transistor P1 is turned on, and the second MOS transistor N1 is turned off. At this time, the output terminal Ao outputs the first high level. level H1.

When both the gate Ap of the first MOS transistor P1 and the gate An of the second MOS transistor N1 input a high level, the first MOS transistor P1 is turned off, and the second MOS transistor N1 is turned on, at this time, the output terminal Ao outputs the first low level L1.

When the gate Ap of the first MOS transistor P1 is input with a high level and the gate An of the second MOS transistor N1 is input with a low level, both the first MOS transistor P1 and the second MOS transistor N1 are turned off, and the output terminal Ao is at a high level at this time.

When the gate Ap of the first MOS transistor P1 is input with a low level, and the gate An of the second MOS transistor N1 is input with a high level, the first MOS transistor P1 and the second MOS transistor N1 are both turned on, and the output terminal Ao is indeterminate state.

In some embodiments of the present disclosure, the above-mentioned second vector file is used to simulate the third MOS transistor P2 and the fourth MOS transistor N2. The types of the third MOS transistor and the fourth MOS transistor are different.

Optionally, the third MOS transistor P2 may be a PMOS transistor, and the fourth MOS transistor N2 may be an NMOS transistor.

In some embodiments, the drain of the third MOS transistor P2 is connected to the second high level H2, and the source is connected to the drain of the fourth MOS transistor N2 to serve as the output terminal Bo, and the source of the fourth MOS transistor N2 is connected to the second low level L2.

In some embodiments, after the second sampling signal is obtained, the second sampling signal is input to the gate Bp of the third MOS transistor P2 and the gate Bn of the fourth MOS transistor N2, so as to turn on the third MOS transistor P2 or the second sampling signal. Four MOS transistors N2, and the signal output by the output terminal Bo is used as the above-mentioned chip select control signal. It can be understood that inputting the second sampling signal into the gate Bp of the third MOS transistor P2 and the gate Bn of the fourth MOS transistor N2 means: sampling the second sampling signal after obtaining the second sampling signal to obtain the third signal and the fourth signal, input the third signal to the gate Bp of the third MOS transistor P2, and input the second signal to the gate Bn of the fourth MOS transistor N2 to generate the chip select control signal.

For example, in the case where the third MOS transistor P2 is a PMOS transistor and the fourth MOS transistor N2 is an NMOS transistor, based on the working principles of the PMOS transistor and the NMOS transistor, it is known as the following.

When both the gate Bp of the third MOS transistor P2 and the gate Bn of the fourth MOS transistor N2 are input with a low level, the third MOS transistor P2 is turned on, the fourth MOS transistor N2 is turned off, and the output terminal Bo outputs the second high level H2.

When both the gate Bp of the third MOS transistor P2 and the gate Bn of the fourth MOS transistor N2 input a high level, the third MOS transistor P2 is turned off, the fourth MOS transistor N2 is turned on, and the output terminal Bo at this time outputs the second low level L2.

When the gate Bp of the third MOS transistor P2 is input with a high level, and the gate Bn of the fourth MOS transistor N2 is input with a low level, the third MOS transistor P2 and the fourth MOS transistor N2 are both turned off, and the output terminal Bo at this time. is high impedance.

When the gate Bp of the third MOS transistor P2 is input with a low level, and the gate Bn of the fourth MOS transistor N2 is input with a high level, the third MOS transistor P2 and the fourth MOS transistor N2 are both turned on, and the output terminal Bo is indeterminate state.

In some embodiments, the first high level H1, the first low level L1, the second high level H2, and the second low level L2 are different from each other.

In some embodiments, the voltage value of the first high level H1 is greater than the voltage value of the second high level H2; the voltage value of the first low level L1 is smaller than the voltage value of the second low level L2.

In some embodiments, when the power supply control signal is a first high level H1 or a first low level L1, the chip select control signal is in a high impedance state; when the chip select control signal is a second high level H2 Or at the second low level L2, the power supply control signal is in a high impedance state.

In some embodiments, the output terminal Ao is connected to the output terminal Bo to serve as the chip select signal output terminal Y. It can be understood that, in order to ensure that the power supply control signal and the chip select control signal in the chip select signal can be identified, the power supply control signal and the chip select control signal should be output sequentially according to actual needs, for example, the chip select control signal is output first, and the power supply control signal is output then, to ensure the synthesized chip select signal contain identifiable power supply control signal and chip select control signal.

For a better understanding of the embodiments of the present disclosure, refer to Table 1, which shows the potential levels of the foregoing ports.

TABLE 1

| Schematic potential levels of each port | | | | |
|---|---|---|---|---|
| Ap | 0 | 1 | 1 | 1 |
| An | 0 | 1 | 0 | 0 |
| Bp | 1 | 1 | 0 | 1 |
| Bn | 0 | 0 | 0 | 1 |
| Ao | H1 | L1 | z | z |
| Bo | z | z | H2 | L2 |
| Y | H1 | L1 | H2 | L2 |

Among them, 1 means high level, 0 means low level, and z means high impedance.

In some embodiments, the chip select signal output by the chip select signal output terminal Y may be sampled to obtain the above-mentioned power supply control signal and chip select control signal.

In some embodiments, after the power supply control signal and the chip select control signal are obtained, the power supply control signal may be input into a preset power supply circuit, so that the power supply circuit outputs an excitation signal or a shutdown signal based on the power supply control signal. Wherein, the excitation signal is used to enable the preset storage circuit, and the shutdown signal is used to turn off the storage circuit, that is, the above-mentioned power supply control signal can realize the power supply control operation. It should be noted that turning off the storage circuit may either completely disconnect the storage circuit, or may control the storage circuit to be in a sleep state, and the storage circuit in the sleep state still needs power supply.

In some embodiments, the chip select control signal may also be input to the storage circuit, so that the enabled storage circuit performs a chip selection operation based on the chip select control signal.

In the method for generating a chip select signal provided by an embodiment of the present disclosure, the first vector file and the second vector file are used to simulate a signal processing circuit composed of some specific semiconductor devices, through which the signal processing circuit can be based on the first sampling signal, and the second sampling signal generates chip select signals with 4 different potentials.

Figure 4:
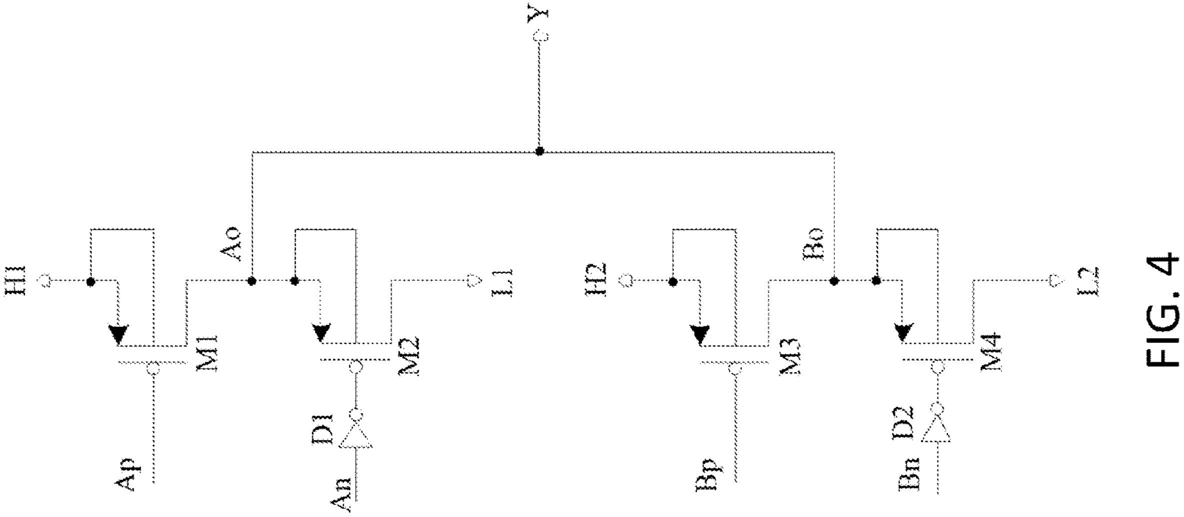
FIG. 4 is another schematic block diagram of a signal processing circuit simulated by a first vector file and a second vector file provided in an embodiment of the present disclosure.

Based on the content described in the above embodiments, in some embodiments, referring to FIG. 4, FIG. 4 is another schematic block diagram of a signal processing circuit simulated by a first vector file and a second vector file provided in the embodiment of the present disclosure.

In some embodiments of the present disclosure, the above-mentioned first vector file is used to simulate the first MOS transistor M1 and the second MOS transistor M2. The first MOS transistor M1 and the second MOS transistor M2 are of the same type.

In some embodiments, the first MOS transistor M1 and the second MOS transistor M2 may both be PMOS transistors.

In some embodiments, the first MOS transistor M1 and the second MOS transistor M2 may both be NMOS transistors.

In some embodiments, the source of the first MOS transistor M1 is connected to the first high level H1, the drain is connected to the drain of the second MOS transistor M2 to serve as the output terminal Ao, and the source of the second MOS transistor M2 Connected to the first low level L1.

The gate of the second MOS transistor M2 is connected to the inverter D1.

In some embodiments, after the first sampling signal is obtained, the first sampling signal is input to the gate Ap of the first MOS transistor M1, and after the first sampling signal is input to the inverter D1, the inverted signal of the first sampling signal of the output of the inverter D1 is input to the gate An of the second MOS transistor M2, the first MOS transistor M1 or the second MOS transistor M2 is turned on, and the signal output from the output terminal Ao is used as the power supply control signal.

In the method for generating a chip select signal provided by an embodiment of the present disclosure, the first vector file and the second vector file are used to simulate two different circuit structures, respectively, and the first sampling signal is input into the first vector file to generate a power supply control signal; input the second sampling signal into the second vector file to generate the chip select control signal; generate the chip selection signal based on the power supply control signal and the chip select control signal; wherein, because the voltage value of the high potential of the power supply control signal and the chip select control signal is different, the voltage values of the low potentials of the power supply control signal and the chip select control signal are different, so that the above two vector files can be used to realize the chip selection signal with 4 different potentials.

Figure 5:
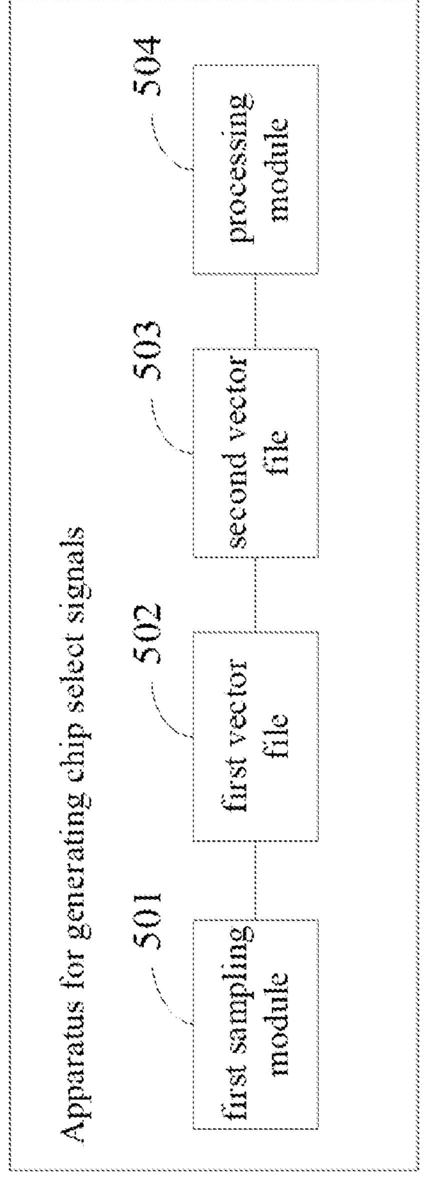
FIG. 5 is a schematic block diagram of a program module of an apparatus for generating a chip select signal provided in an embodiment of the present disclosure.
Figure 5:

Based on the contents described in the foregoing embodiments, an apparatus for generating a chip select signal is also provided in the embodiments of the present disclosure. Referring to FIG. 5, FIG. 5 is a schematic block diagram of a program module of an apparatus for generating a chip select signal provided in an embodiment of the present disclosure. The apparatus for generating a chip select signal includes the following.

The first sampling module 501 is configured to receive an external control signal input from a chip select port, and sample the external control signal to obtain a first sampling signal and a second sampling signal.

The first vector file 502 is used to receive the first sampling signal, and output a corresponding power supply control signal based on the first sampling signal.

The second vector file 503 is configured to receive the second sampling signal, and output a corresponding chip select control signal based on the second sampling signal.

The forms of the power supply control signal and the chip select control signal include high potential, low potential and high impedance state, and the voltage values of the power supply control signal and the high potential of the chip select control signal are different. The voltage values of the low potential of the control signal and the chip select control signal are different;

The processing module 504 is configured to generate the chip selection signal based on the power supply control signal and the chip select control signal, where the chip selection signal is used to perform a power supply control operation and a chip selection operation.

In a feasible implementation manner, the first vector file 502 is used to simulate a first MOS transistor and a second MOS transistor, the first MOS transistor and the second MOS transistor are of different types, and the first MOS transistor is of different type. The drain of the MOSFET is connected to the first high level, the source of the first MOS transistor is connected to the drain of the second MOS transistor as an output terminal, the source of the second MOS transistor is connected to the first low level connection;

The gate of the first MOS transistor and the gate of the second MOS transistor are used for receiving the first sampling signal.

In a feasible implementation manner, the second vector file 503 is used to simulate a third MOS transistor and a fourth MOS transistor, the third MOS transistor and the fourth MOS transistor are of different types, and the third MOS transistor is of different type. The drain of the MOSFET is connected to the second high level, the source of the third MOS transistor is connected to the drain of the fourth MOS transistor as an output terminal, the source of the fourth MOS transistor is connected to the second low level connection;

The gate of the third MOS transistor and the gate of the fourth MOS transistor are used for receiving the second sampling signal.

In a feasible implementation manner, the voltage value of the first high level is greater than the voltage value of the second high level, and the voltage value of the first low level is smaller than the voltage value of the second low level.

In a feasible implementation manner, the above-mentioned apparatus further includes a second sampling module.

The chip selection signal is sampled to obtain the power supply control signal and the chip select control signal.

It should be noted that, for the specific content executed by the first sampling module 501, the first vector file 502, the second vector file 503, and the processing module 504 in the embodiment of the present disclosure, reference may be made to the relevant content in the embodiments shown in FIG. 1 to FIG. 4. It is not repeated here.

Further, based on the content described in the foregoing embodiments, the embodiments of the present disclosure further provide an electronic device, the electronic device includes at least one processor and a memory; wherein, the memory stores computer execution instructions in the above-mentioned at least one processor. The computer execution instructions stored in the memory are executed to implement each step in the method for generating a chip select signal as described in the foregoing embodiment, which will not be repeated in this embodiment.

Figure 6:
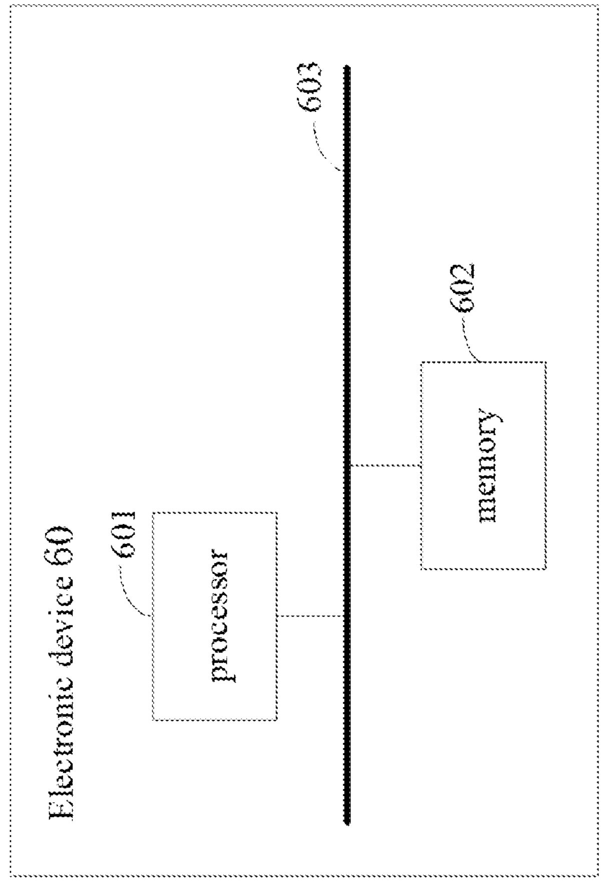
FIG. 6 is a schematic diagram of a hardware structure of the electronic apparatus according to an embodiment of the present disclosure.

For a better understanding of the embodiments of the present disclosure, refer to FIG. 6, which a schematic diagram of a hardware structure of the electronic apparatus according to an embodiment of the present disclosure.

As shown in FIG. 6, the electronic device 60 in this embodiment includes: a processor 601 and a memory 602; wherein:

a memory 602 for storing computer-executed instructions.

The processor 601 is configured to execute the computer-executed instructions stored in the memory, so as to implement each step in the method for generating a chip select signal described in the foregoing embodiments. For details, refer to the relevant descriptions in the foregoing method embodiments.

Optionally, the memory 602 may be independent or integrated with the processor 601.

When the memory 602 is provided independently, the device further includes a bus 603 for connecting the memory 602 and the processor 601.

Further, based on the content described in the foregoing embodiments, the embodiments of the present disclosure further provide a computer-readable storage medium, where computer-executable instructions are stored in the computer-readable storage medium, and when the processor executes the computer-executable instructions In order to implement the various steps in the method for generating a chip select signal as described in the foregoing embodiment, details are not described herein again in this embodiment.

In the several embodiments provided in the present disclosure, it should be understood that the disclosed apparatus and method may be implemented in other manners. For example, the device embodiments described above are only illustrative. For example, the division of the modules is only a logical function division. In actual implementation, there may be other division methods. For example, multiple modules may be combined or integrated. to another system, or some features can be ignored, or not implemented. On the other hand, the shown or discussed mutual coupling or direct coupling or communication connection may be through some interfaces, indirect coupling or communication connection of devices or modules, and may be in electrical, mechanical or other forms.

The modules described as separate components may or may not be physically separated, and the components shown as modules may or may not be physical units, that is, may be located in one place, or may be distributed to multiple network units. Some or all of the modules may be selected according to actual needs to achieve the purpose of the solution in this embodiment.

In addition, each functional module in each embodiment of the present disclosure may be integrated into one processing unit, or each module may exist physically alone, or two or more modules may be integrated into one unit. The unit integrated with the above modules can be implemented in the form of hardware, or can be implemented in the form of hardware plus software functional units.

The above-mentioned integrated modules implemented in the form of software functional modules may be stored in a computer-readable storage medium. The above-mentioned software function modules are stored in a storage medium, and include several instructions to enable a computer device (which may be a personal computer, a server, or a network device, etc.) or a processor to execute part of the method in the various embodiments of the present disclosure.

It should be understood that the above processor may be a central processing unit (English: Central Processing Unit, referred to as: CPU), and may also be other general-purpose processors, digital signal processors (English: Digital Signal Processor, referred to as: DSP), application-specific integrated circuits (English: Application Specific Integrated Circuit, referred to as: ASIC) and so on. A general purpose processor may be a microprocessor or the processor may be any conventional processor or the like. The steps of the method disclosed in conjunction with the present disclosure can be directly embodied as executed by a hardware processor, or executed by a combination of hardware and software modules in the processor.

The memory may include a high-speed RAM memory, and may also include a non-volatile storage NVM, such as at least one magnetic disk memory, and may also be a U disk, a removable hard disk, a read-only memory, a magnetic disk or an optical disk, and the like.

The bus may be an Industry Standard Architecture (Industry Standard Architecture, ISA) bus, a Peripheral Component (Peripheral Component, PCI) bus, or an Extended Industry Standard Architecture (Extended Industry Standard Architecture, EISA) bus, or the like. The bus can be divided into address bus, data bus, control bus and so on. For ease of representation, the buses in the drawings of the present disclosure are not limited to only one bus or one type of bus.

The above storage medium can be implemented by any type of volatile or non-volatile storage devices or combinations thereof, such as Static Random Access Memory (SRAM), Electrically Erasable Programmable Read-Only Memory (EEPROM), Erasable Except Programmable Read Only Memory (EPROM), Programmable Read Only Memory (PROM), Read Only Memory (ROM), Magnetic Memory, Flash Memory, Magnetic Disk or Optical Disk. A storage medium can be any available medium that can be accessed by a general purpose or special purpose computer.

An exemplary storage medium is coupled to the processor, such that the processor can read information from, and write information to, the storage medium. Of course, the storage medium can also be an integral part of the processor. The processor and the storage medium may be located in application specific integrated circuits (Application Specific Integrated Circuits, ASIC for short). Of course, the processor and the storage medium may also exist in the electronic device or the host device as discrete components.

Those of ordinary skill in the art can understand that all or part of the steps of implementing the above method embodiments may be completed by program instructions related to hardware. The aforementioned program can be stored in a computer-readable storage medium. When the program is executed, the steps including the above method embodiments are executed; and the aforementioned storage medium includes: ROM, RAM, magnetic disk or optical disk and other media that can store program codes.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: The technical solutions described in the foregoing embodiments can still be modified, or some or all of the technical features thereof can be equivalently replaced; and these modifications or replacements do not make the essence of the corresponding technical solutions deviate from the scope of the embodiments of the present disclosure.

The invention claimed is:

1. A method for generating a chip select signal, wherein the method comprises:

receiving an external control signal input from a chip select port, and sampling the external control signal to obtain a first sampling signal and a second sampling signal;

inputting the first sampling signal into a first vector file to generate a power supply control signal; and inputting the second sampling signal into a second vector file to generate a chip select control signal;

wherein the power supply control signal and the chip select control signal comprise a high potential, a low potential and a high impedance state, and wherein voltage values of the high potential of the power supply control signal and the chip select control signal are different, and wherein voltage values of the low potential of the power supply control signal and the chip select control signal are different; and wherein the chip select signal is generated based on the power supply control signal and the chip select control signal, and wherein the chip select signal performs a power supply control operation and a chip select operation.

2. The method according to claim 1, wherein the first vector file simulates a first MOS transistor and a second MOS transistor, wherein the first MOS transistor and the second MOS transistor are of different types, wherein a drain of the first MOS transistor is connected to a first high level, a source of the first MOS transistor is connected to a drain of the second MOS transistor as an output terminal, and a source of the second MOS transistor is connected to a first low level;

wherein inputting the first sampling signal into the first vector file to generate the power supply control signal comprises:

inputting the first sampling signal into a gate of the first MOS transistor and a gate of the second MOS transistor to turn on the first MOS transistor or the second MOS transistor and output the power supply control signal.

3. The method according to claim 2, wherein the first MOS transistor is a PMOS transistor, and the second MOS transistor is an NMOS transistor.

4. The method according to claim 2, wherein the second vector file simulates a third MOS transistor and a fourth MOS transistor, wherein the third MOS transistor and the fourth MOS transistor are of different types, so a drain of the third MOS transistor is connected to a second high level, a source of the third MOS transistor is connected to a drain of the fourth MOS transistor as an output terminal, and a source of the fourth MOS transistor is connected to a second low level;

wherein inputting the second sampling signal into the second vector file to generate the chip select control signal comprises:

inputting the second sampling signal into a gate of the third MOS transistor and a gate of the fourth MOS transistor to turn on the third MOS transistor or the fourth MOS transistor and output the chip select control signal.

5. The method of claim 4, wherein the third MOS transistor is a PMOS transistor, and the fourth MOS transistor is an NMOS transistor.

6. The method of claim 4, wherein a voltage value of the first high level is greater than a voltage value of the second high level, and wherein a voltage value of the first low level is less than a voltage value of the second low level.

7. The method according to claim 1, wherein the first vector file simulates a first MOS transistor and a second MOS transistor, wherein the first MOS transistor and the second MOS transistor are of a same type, so a drain of the first MOS transistor is connected to a first high level, a source of the first MOS transistor is connected to a drain of the second MOS transistor as an output terminal, and a source of the second MOS transistor is connected to a first low level;

wherein inputting the first sampling signal into the first vector file to generate the power supply control signal comprises:

inputting the first sampling signal to a gate of the first MOS transistor, and inputting an inverted signal of the first sampling signal to a gate of the second MOS transistor to turn on the first MOS transistor or the second MOS transistor and output the power supply control signal.

8. The method according to claim 1, wherein after the generating the chip select signal based on the power supply control signal and the chip select control signal, the method further comprises:

sampling the chip select signal to obtain the power supply control signal and the chip select control signal.

9. The method according to claim 8, wherein after the sampling the chip select signal to obtain the power supply control signal and the chip select control signal, the method further comprises:

inputting the power supply control signal to a preset power supply circuit, so that the preset power supply circuit outputs an excitation signal or a shutdown signal based on the power supply control signal, wherein the excitation signal enables a preset storage circuit, and a shutdown signal turns off the preset storage circuit; and inputting the chip select control signal to the storage circuit, so that the preset storage circuit performs a chip select operation based on the chip select control signal.

10. An apparatus for generating a chip select signal, comprising:

a first sampling module, configured to receive an external control signal input from a chip select port, and to sample the external control signal to obtain a first sampling signal and a second sampling signal;

a first vector file for receiving the first sampling signal and outputting a power supply control signal based on the first sampling signal;

a second vector file for receiving the second sampling signal and outputting a chip select control signal based on the second sampling signal;

wherein the power supply control signal and the chip select control signal comprise a high potential, a low potential and a high resistance state, wherein voltage values of the power supply control signal and the high potential of the chip select control signal are different, and voltage values of the low potential of the power supply control signal and the chip select control signal are different; and a processing module, configured to generate the chip select signal based on the power supply control signal and the chip select control signal, where the chip selection signal performs a power supply control operation and a chip select operation.

11. The apparatus according to claim 10, wherein the first vector file simulates a first MOS transistor and a second MOS transistor, wherein the first MOS transistor and the second MOS transistor are of different types, wherein a drain of the first MOS transistor is connected to a first high level, a source of the first MOS transistor is connected to a drain of the second MOS transistor as an output terminal, and a source of the second MOS transistor is connected to ae first low level; and wherein a gate of the first MOS transistor and a gate of the second MOS transistor are configured to receive the first sampling signal.

12. The apparatus according to claim 11, wherein the second vector file simulates a third MOS transistor and a fourth MOS transistor, wherein the third MOS transistor and the fourth MOS transistor are of different types, wherein a drain of the third MOS transistor is connected to a second high level, a source of the third MOS transistor is connected to a drain of the fourth MOS transistor as an output terminal, and a source of the fourth MOS transistor is connected to a second low level; and wherein a gate of the third MOS transistor and a gate of the fourth MOS transistor receive the second sampling signal.

13. The apparatus of claim 12, wherein a voltage value of the first high level is greater than a voltage value of the second high level, and a voltage value of the first low level is less than a voltage value of the second low level.

14. The apparatus of claim 10, further comprising a second sampling module for sampling the chip select signal to obtain the power supply control signal and the chip select control signal.

15. An electronic device comprising: at least one processor and a memory;

wherein the memory stores computer-executable instructions;

wherein the at least one processor executes the computer-executable instructions stored in the memory, so that the at least one processor executes the method for generating the chip select signal according to claim 1.

16. A non-transitory computer-readable storage medium, wherein computer-executable instructions are stored in the non-transitory computer-readable storage medium, wherein when a processor executes computer-executable instructions, the chip select signal is implemented with the method according to claim 1.

* * * * *